United States Patent
Yu

(10) Patent No.: US 7,381,605 B2
(45) Date of Patent: Jun. 3, 2008

(54) METHOD FOR FABRICATING SEMICONDUCTOR DEVICE WITH DUAL POLY-RECESS GATE

(75) Inventor: Jae-Seon Yu, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 185 days.

(21) Appl. No.: 11/452,036

(22) Filed: Jun. 12, 2006

(65) Prior Publication Data

US 2007/0148876 A1    Jun. 28, 2007

(30) Foreign Application Priority Data

Dec. 28, 2005    (KR)  ............... 10-2005-0132498

(51) Int. Cl.
*H01L 21/336*    (2006.01)
(52) U.S. Cl. ............... 438/197; 438/259; 438/270
(58) Field of Classification Search ............... 437/197, 437/258, 259, 270, 275, 279
See application file for complete search history.

(56) References Cited

U.S. PATENT DOCUMENTS

2006/0141691 A1*    6/2006 Kim ............... 438/199
2006/0270154 A1*   11/2006 Yamazaki ............... 438/253
2007/0155148 A1*    7/2007 Kim ............... 438/589

FOREIGN PATENT DOCUMENTS

| JP | 2002-246596 | 8/2002 |
| KR | 10-2005-0008223 | 1/2005 |
| KR | 10-2005-0073099 | 7/2005 |
| KR | 10-2006-0027525 | 3/2006 |
| KR | 10-2006-0075240 | 7/2006 |

* cited by examiner

*Primary Examiner*—Tuan H Nguyen
(74) *Attorney, Agent, or Firm*—Blakely, Sokoloff, Taylor & Zafman LLP

(57) ABSTRACT

A method for fabricating a semiconductor device includes: forming a first polysilicon layer of a first conductive type over a substrate divided into a cell region and a peripheral region, the first polysilicon layer covering the peripheral region and opening predetermined recess portions of the cell region; etching the predetermined recess portions using the first polysilicon layer as an etch mask to form recesses; forming a second polysilicon layer of a second conductive type over the substrate in the cell region and the first polysilicon layer remaining in the peripheral region after the recesses are formed; selectively removing the second polysilicon layer formed over the remaining first polysilicon layer in the peripheral region; planarizing the second polysilicon layer in the cell region; and patterning the second polysilicon layer in the cell region and the first polysilicon layer in the peripheral region to form gate patterns in a dual poly-recess structure.

13 Claims, 3 Drawing Sheets

METHOD FOR FABRICATING SEMICONDUCTOR DEVICE WITH DUAL POLY-RECESS GATE

FIELD OF THE INVENTION

The present invention relates to a method for fabricating a semiconductor device; and more particularly, to a method for fabricating a semiconductor device with a dual poly-recess gate.

DESCRIPTION OF RELATED ARTS

As semiconductor devices are becoming highly integrated, employing a typical method for fabricating a planar gate over a planarized active region is becoming more difficult to secure a refresh characteristic due to junction leakage current, which is often generated by an increasing electric field as a gate channel is elongated and an ion implantation doping concentration is increased.

Hence, a gate recess process is employed to secure the refresh characteristic. According to the gate recess process, an active region of a substrate is etched to have a recess, and a gate is formed in the recess.

As a method for fabricating a gate to improve device characteristics, instead of using the same polysilicon layer to form gates in a P-channel metal oxide semiconductor (PMOS) region and in an N-channel metal oxide semiconductor (NMOS) region, a P-type polysilicon layer and an N-type polysilicon layer are formed in the PMOS region and the NMOS region, respectively to form a dual poly-gate, which can realize an intended level of operation speed and low voltage operation.

Particularly, in those devices with small feature sizes, dual poly-gates need to be formed in a recess gate structure in a cell region to obtain the above mentioned device characteristics. For the dual poly-gate formation, an undoped polysilicon layer is formed on the entire surface of a wafer. An N-type ion implantation process is performed in an N+-type doped region using a N+-type photosensitive layer to form an N-type doped polysilicon layer, while a P-type ion implantation process is performed in a P+-type doped region using a P+-type photosensitive layer to form a P-type doped polysilicon layer. For instance, the N-type ion implantation process and the P-type ion implantation process use phosphorus and boron, respectively. As a result of the selective N-type and P-type ion implantation processes, an N-type doped polysilicon layer and a P-type doped polysilicon layer are formed.

In a structure where the dual poly-gates and the recess gates are combined together, the N-type ion implantation process needs to be performed on the undoped polysilicon layer in the cell region. However, the undoped polysilicon layer inside the U-shaped recess gates is thicker than other regions, and thus, channels in an active region of a substrate may be damaged when the N-type ion implantation process is performed on the undoped polysilicon layer inside the U-shaped recess gates. Hence, when the dual poly-gates are formed, it is difficult to change the undoped polysilicon layer inside the recess gates into the N-type doped polysilicon layer.

SUMMARY OF THE INVENTION

It is, therefore, an object of the present invention to provide a method for fabricating a semiconductor device with a dual poly-recess gate, wherein the method can allow an ion implantation of a gate conductive material inside a recess, so that the gate conductive material is doped with an intended type of an impurity.

In accordance with an aspect of the present invention, there is provided a method for fabricating a semiconductor device, including: forming a first polysilicon layer of a first conductive type over a substrate divided into a cell region and a peripheral region, the first polysilicon layer covering the substrate in the peripheral region and opening predetermined portions of the substrate in the cell region where recesses are to be formed; etching the predetermined portions of the substrate using the first polysilicon layer as an etch mask to form recesses; forming a second polysilicon layer of a second conductive type over the substrate in the cell region and the first polysilicon layer remaining in the peripheral region after the recesses are formed; selectively removing the second polysilicon layer formed over the remaining first polysilicon layer in the peripheral region; planarizing the second polysilicon layer in the cell region; and patterning the second polysilicon layer in the cell region and the first polysilicon layer in the peripheral region to form gate patterns in a dual poly-recess structure.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Hereinafter, exemplary embodiments of the present invention will be described in detail with reference to the accompanying drawings.

FIGS. 1A to 1E are cross-sectional views illustrating a method for fabricating a semiconductor device with a dual poly-recess gate in accordance with an embodiment of the present invention.

Figure 1A:
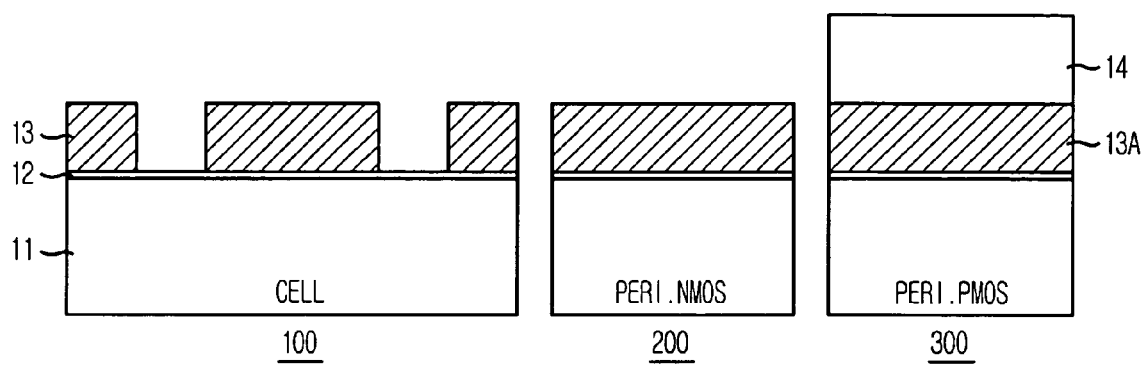
FIGS. 1A to 1E are cross-sectional views illustrating a method for fabricating a semiconductor device with a dual recess gate in accordance with an embodiment of the present invention.

Referring to FIG. 1A, a sacrificial oxide layer 12 is formed over a substrate 11 defined into a cell region 100 and NMOS and PMOS regions 200 and 300 of a peripheral region. A P-type polysilicon layer 13 or 13A is formed over the sacrificial oxide layer 12. The P-type polysilicon layer 13 or 13A is used as a hard mask for a subsequent recess etching process in a cell region 100 and as a gate electrode in the PMOS region 300 of the peripheral region. Herein, the P-type polysilicon layer formed in the cell region 100 and the NMOS region 200 of the peripheral region will be denoted with reference numeral 13, while the P-type polysilicon layer formed in the PMOS region 300 of the peripheral region will be denoted with reference numeral 13A.

Although not illustrated, a first photosensitive layer is formed over the P-type polysilicon layer 13 or 13A and is subjected to a photo-exposure and developing process to form a photosensitive pattern, which opens predetermined portions of the substrate 11 in the cell region 100 where recesses are to be formed. Using the photosensitive pattern, the P-type polysilicon layer 13 in the cell region 100 is etched. The polysilicon layer 13 in the cell region 100 is etched using a gas alone or in combination with at least two gases selected from the group consisting of $Cl_2$, HBr and BCl$_3$. Using the selected single or mixed gas as a main etch gas, O$_2$ or N$_2$ is added thereto to increase etch selectivity of the P-type polysilicon layer 13 to the sacrificial oxide layer 12.

The first photosensitive layer is etched away at the point of completing the etching of the P-type polysilicon layer 13 in the cell region 100. A second photosensitive layer 14 is formed over the P-type polysilicon layer 13A in the PMOS region 300 to protect the P-type polysilicon layer 13A against a subsequent etching process for forming the above mentioned recesses in the cell region 100.

Figure 1B:
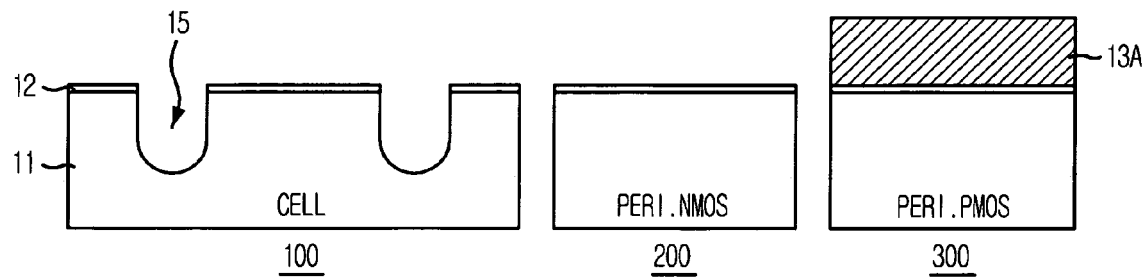

Referring to FIG. 1B, predetermined portions of the substrate 11 are etched using the P-type polysilicon layer 13, patterned with use of the photosensitive pattern in the cell region 100, as an etch mask to form recesses 15 in the cell region 100. The recesses 15 are formed in an apparatus such as an inductively coupled plasma (ICP) reactor, a decoupled plasma source (DPS) reactor, an electron cyclotron resonance (ECR) reactor or a magnetically enhanced reactive ion etching (MERIE) reactor using a gas mixture including Cl$_2$, HBr, Ar and O$_2$ gases. Each of the Cl$_2$, HBr and Ar gases has a flow quantity ranging from approximately 10 sccm to approximately 100 sccm, and the O$_2$ gas has a flow quantity ranging from approximately 1 sccm to approximately 20 sccm. Also, a bottom power of approximately 50 W to approximately 400 W and a pressure of approximately 5 mTorr to approximately 50 mTorr are used to form the recesses 15 in the cell region 100.

At the point of forming the recesses 15, the P-type polysilicon layer 13 in the cell region 100 and in the NMOS region 200 of the peripheral region is etched away. However, the P-type polysilicon layer 13A in the PMOS region 300 is not etched away due to the second photosensitive layer 14.

Using a plasma containing CF and O$_2$, a light etch treatment, which is a post treatment process after the recess etching process, is performed to round top portions of the recesses 15 and reduce horns, often generated at bottom portions and plasma damage to the substrate 11, generally generated when the recesses 15 are formed.

Figure 1C:
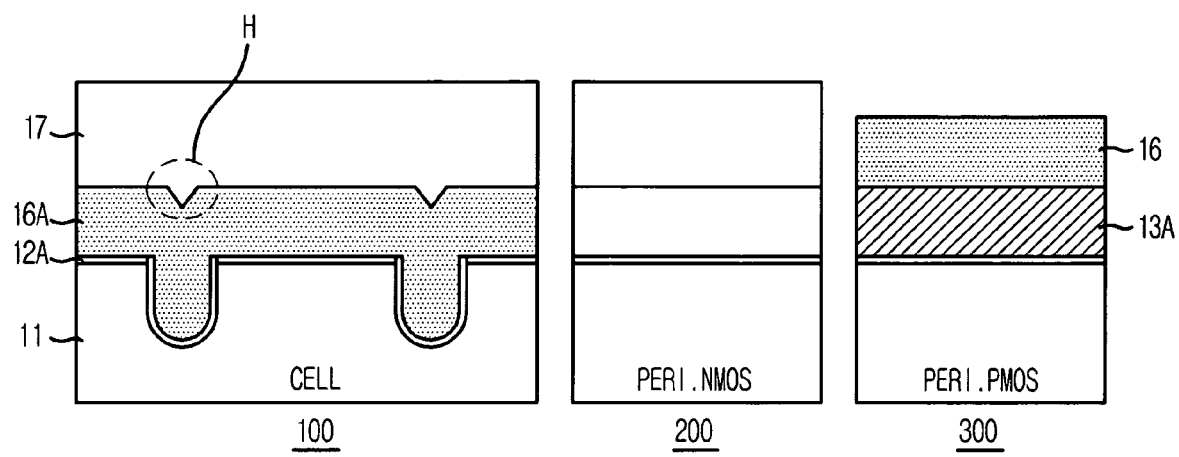

Referring to FIG. 1C, the sacrificial oxide layer 12 remaining after the recesses 15 are formed is removed by a wet etching process to compensate degraded reliability, often caused by a thickness difference in the remaining sacrificial oxide layer 12 depending on a position of the sacrificial oxide layer 12 over the substrate 11.

Another sacrificial oxide layer 12A is formed. Particularly, the other sacrificial oxide layer 12A is to be used as a gate insulation layer, and thus, hereinafter referred to as "gate insulation layer."

An N-type doped polysilicon layer 16 or 16A is formed over the above resulting structure. Particularly, the N-type doped polysilicon layer formed in the cell region 100 and in the NMOS region 200 is denoted with reference numeral 16A, while the N-type doped polysilicon layer formed in the PMOS region 300 is denoted with reference numeral 16. The N-type doped polysilicon layer 16A formed in the cell region 100 and the NMOS region 200 of the peripheral region is to be used as a gate lining layer. At this time, horns H are generated in the N-type doped polysilicon layer 16A in the cell region 100 due to the recesses 15.

A third photosensitive layer 17 is formed over the N-type doped polysilicon layer 16A in the cell region 100 and the NMOS region 200 of the peripheral region to remove the N-type doped polysilicon layer 16 in the PMOS region 300, so that the N-type doped polysilicon layer 16A remaining in the cell region and the NMOS region 200 can be used as the gate lining layer.

Figure 1D:
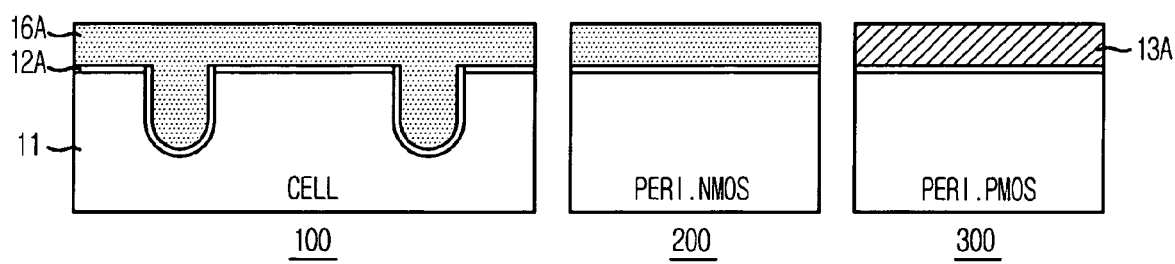

Referring to FIG. 1D, the N-type doped polysilicon layer 16 formed in the PMOS region 300 of the peripheral region is removed and the third photosensitive layer 17 is stripped thereafter.

A chemical mechanical polishing (CMP) process is performed to remove the horns H in the N-type doped polysilicon layer 16A in the cell region 100. The horns H are removed to allow easy formation of gate patterns. When the CMP process is performed on the N-type doped polysilicon layer 16A in the cell region 100, the N-type doped polysilicon layer 16A in the NMOS region 200 and the P-type doped polysilicon layer 13A in the PMOS region 300 are chemically and mechanically polished, thereby having reduced thicknesses substantially proportionate to the polished amount.

After the CMP process, dual poly-recess gates are obtained by forming the N-type doped polysilicon layer 16A in the cell region 100 and the NMOS region 200 of the peripheral region and the P-type doped polysilicon layer 16 in the PMOS region 300.

Figure 1E:
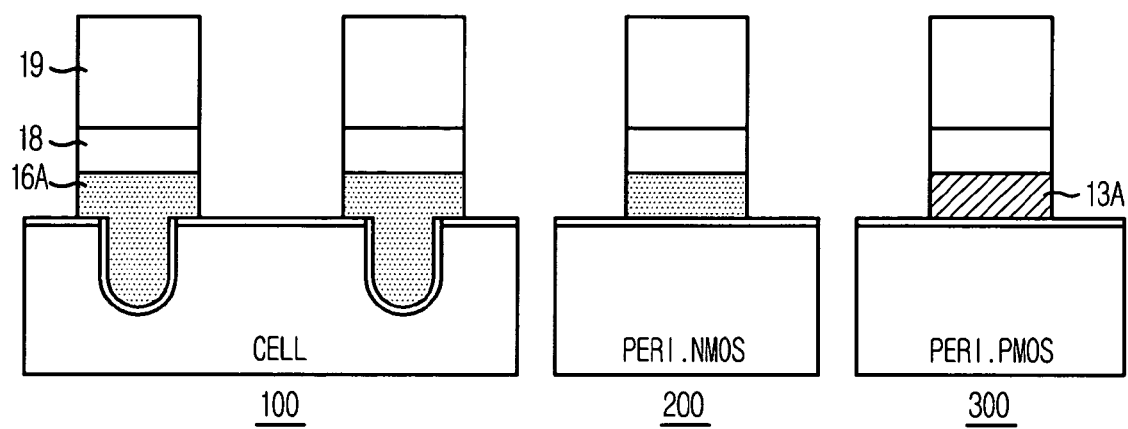

Referring to FIG. 1E, a gate electrode 18 and a gate hard mask 19 are sequentially formed over the N-type doped polysilicon layer 16A and the P-type doped polysilicon layer 13A and patterned to form gate patterns. The gate electrode 18 includes one selected from the group consisting of W, WSi$_x$, Co$_x$Si$_x$, and Ti$_x$Si$_x$.

In more detail of the gate patterning process, the gate hard mask 19 and the gate electrode 18 are etched in a high density plasma etching apparatus such as an ICP reactor, a DPS reactor or an ECR reactor using a gas alone or in combination with at least two gases selected from the group consisting of BCl$_3$, C$_x$F$_x$, NF$_x$, SF$_x$, and Cl$_2$. Each of the BCl$_3$, C$_x$F$_x$, NF$_x$ and SF$_x$ gases has a flow quantity ranging from approximately 10 sccm to approximately 50 sccm, and the Cl$_2$ gas has a flow quantity ranging from approximately 50 sccm to approximately 200 sccm.

Particularly, in the case of using the ICP reactor or the DPS reactor, a source power of approximately 500 W to approximately 2,000 W is used. In addition to the above mentioned gas, which is a main etch gas, a mixture gas is added to the main etch gas. The mixture gas is selected alone or in combination with at least two from the group consisting of O$_2$, N$_2$, Ar, and He. At this point, the O$_2$ gas has a flow quantity ranging from approximately 1 sccm to approximately 20 sccm; the N$_2$ gas has a flow quantity ranging from approximately 1 sccm to approximately 100 sccm; the Ar gas has a flow quantity ranging approximately 50 sccm to approximately 200 sccm; and the He gas has a flow quantity ranging from approximately 50 sccm to approximately 200 sccm. In the case of using the ECR reactor, microwave power of approximately 1,000 W to approximately 3,000 W is used, and a mixture gas is added to the main etch gas. The mixture gas is selected alone or in combination with at least two gases from the group consisting of O$_2$, N$_2$, Ar, and He. At this point, the O$_2$ gas has a flow quantity ranging from approximately 1 sccm to approximately 20 sccm; the N$_2$ gas has a flow quantity ranging from approximately 1 sccm to approximately 100 sccm; the Ar gas has a flow quantity ranging from approximately 50 sccm to approximately 200 sccm; and the He gas has a flow quantity ranging from approximately 50 sccm to approximately 200 sccm.

The N-type doped polysilicon layer 16A and the P-type doped polysilicon layer 13A are etched to be used as gate lining layers. This etching process is carried out in a high density plasma etching apparatus using a plasma including a mixture of HBr and O$_2$. The high density plasma etching apparatus is selected from the group consisting of an ICP reactor, a DPS reactor and an ECR reactor. In the case of using the ICP or DPS reactor, a source power of approximately 500 W to approximately 2,000 W is used. A flow quantity of the HBr gas ranges from approximately 50 sccm to approximately 200 sccm, and that of the $O_2$ gas ranges from approximately 2 sccm to approximately 20 sccm. In the case of using the ECR reactor, microwave power of approximately 1,000 W to approximately 3,000 W is used. The HBr gas has a flow quantity ranging from approximately 50 sccm to approximately 200 sccm, and the $O_2$ gas has a flow quantity ranging from approximately 2 sccm to approximately 20 sccm.

After the above etching process, an over etching process is performed using a plasma including $Cl_2$ and $N_2$ or a plasma including $Cl_2$ and $N_2$ added with $O_2$ or He. The $Cl_2$ is supplied with a flow quantity of approximately 20 sccm to approximately 150 sccm, and the $N_2$ with a flow quantity of approximately 10 sccm to approximately 100 sccm. The over etching process is performed to protect the gate insulation layer 12A even if the gate insulation layer 12A underneath the N-type doped polysilicon layer 16A and the P-type doped polysilicon layer 13A is exposed. In other words, the N-type doped polysilicon layer 16A and the P-type doped polysilicon layer 13A have high selectivity with respect to the gate insulation layer 12A.

On the basis of the present embodiment, using the impurity doped polysilicon layer as a hard mask and a gate lining layer makes it possible to eliminate a difficulty in ion implanting a polysilicon layer that is more likely to be undoped due to the depth of a recess. Also, by using the recess gate structure, a refresh characteristic can be improved, and the dual poly-gate including the doped polysilicon layer can improve operation speed and achieve low operation voltage. As a result, semiconductor devices with fine feature sizes can be obtained with high quality.

The present application contains subject matter related to the Korean patent application No. KR 2005-0132498, filed in the Korean Patent Office on Dec. 28, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first polysilicon layer over a substrate divided into a cell region and a peripheral region, the first polysilicon layer covering the substrate in the peripheral region and opening predetermined portions of the substrate in the cell region where recesses are to be formed;
    etching the predetermined portions of the substrate using the first polysilicon layer as an etch mask to form recesses;
    forming a second polysilicon layer over the substrate in the cell region and the first polysilicon layer remaining in the peripheral region after the recesses are formed;
    selectively removing the second polysilicon layer formed over the remaining first polysilicon layer in the peripheral region;
    planarizing the second polysilicon layer in the cell region; and
    patterning the second polysilicon layer in the cell region and the first polysilicon layer in the peripheral region to form gate patterns in a dual poly-recess structure.

2. The method of claim 1, wherein the forming of the first polysilicon layer comprises:
    forming a sacrificial oxide layer over the substrate;
    forming the first polysilicon layer over the sacrificial oxide layer;
    forming a photosensitive layer over the first polysilicon layer;
    performing a photo-exposure and developing process on the first polysilicon layer to cover the substrate in the peripheral region and open the predetermined portion of the substrate in the cell region where the recesses are to be formed; and
    etching the first polysilicon layer using the photosensitive layer as an etch mask.

3. The method of claim 2, wherein the etching of the first polysilicon layer is carried out using a main etch gas with an additive gas added to the main etch gas, wherein the main etch gas is selected from the group consisting of $Cl_2$, HBr, $BCl_3$, and a mixture containing at least two thereof, and the additive gas is one of $O_2$ and $N_2$.

4. The method of claim 1, wherein the etching to form the recesses is carried out in an apparatus selected from the group consisting of an inductively coupled plasma (ICP) reactor, a decoupled plasma source (DPS) reactor, an electron cyclotron resonance (ECR) reactor, and a magnetically enhanced reactive ion etching (MERIE) reactor.

5. The method of claim 4, wherein the etching to form the recesses is carried out using a mixture gas including $Cl_2$, HBr, $O_2$ and Ar gases.

6. The method of claim 5, wherein each of the $Cl_2$, HBr and Ar gases of the mixture gas have a flow quantity ranging from approximately 10 sccm to approximately 100 sccm, and the $O_2$ gas of the mixture gas has a flow quantity ranging from approximately 1 sccm to approximately 20 sccm.

7. The method of claim 4, wherein the etching to form the recesses is carried out using a bottom power of approximately 50 W to approximately 400 W and a pressure of approximately 5 mTorr to approximately 50 mTorr.

8. The method of claim 1, prior to forming the second polysilicon layer, further comprising:
    performing a post-treatment process to round top portions of the recesses;
    removing the sacrificial oxide layer; and
    forming another sacrificial oxide layer over the substrate.

9. The method of claim 8, wherein the post-treatment process is carried out using a plasma including CF and $O_2$.

10. The method of claim 8, wherein the removing of the sacrificial oxide layer is carried out employing a wet etching process.

11. The method of claim 1, wherein the patterning to form the gate patterns comprises:
    sequentially forming a conductive layer and a gate hard mask layer over the first polysilicon layer and over the second polysilicon layer; and
    etching the gate hard mask layer, the conductive layer and the first and second polysilicon layers to form the gate patterns.

12. The method of claim 11, wherein the conductive layer includes one of W and $WSi_x$.

13. The method of claim 1, wherein the first polysilicon layer and the second polysilicon layer are doped with a P-type impurity and an N-type impurity, respectively.

* * * * *